United States Patent [19]
Brunner

[11] Patent Number: 4,929,083
[45] Date of Patent: May 29, 1990

[54] FOCUS AND OVERLAY CHARACTERIZATION AND OPTIMIZATION FOR PHOTOLITHOGRAPHIC EXPOSURE

[75] Inventor: Timothy A. Brunner, Palo Alto, Calif.

[73] Assignee: Xerox Corporation, Stamford, Conn.

[21] Appl. No.: 326,482

[22] Filed: Mar. 20, 1989

Related U.S. Application Data

[63] Continuation of Ser. No. 876,316, Jun. 19, 1986, abandoned.

[51] Int. Cl.$^5$ .......................... G01B 11/00; G01J 1/00
[52] U.S. Cl. ...................................... 356/400; 356/123
[58] Field of Search ...................... 356/400, 401, 123; 250/201 AF

[56] References Cited

U.S. PATENT DOCUMENTS

| | | | |
|---|---|---|---|
| 4,585,342 | 4/1986 | Lin et al. | 356/124 |
| 4,631,416 | 12/1986 | Trutna | 356/400 |
| 4,636,077 | 1/1977 | Nomura et al. | 356/400 |

OTHER PUBLICATIONS

T. A. Brunner et al., "Moire Technique for Overlay Metrology", IC Metrology Conference, May 3, 1984, vol. 480, pp. 164–170.

Herbert E. Mayer et al., "Improvement of Overlay and Focusing Accuracy of Wafer Step-and-Repeat Aligners by Automatic Calibration", SPIE, vol. 470, Optical Microlithography, III: Technology for the Next Decade, 1984.

T. A. Brunner et al., In Situ Measurement of an Image During Lithographic Exposure, IEEE, vol. EDL6, No. 7, Jul. 1985.

Primary Examiner—Richard A. Rosenberger

[57] ABSTRACT

The focus and overlay alignment of photolithographic exposure tools of the type wherein the location of the wafer is accurately tracked with respect to a baseline position, such as in step and repeat cameras, are evaluated by monitoring the output signal generated by a photodetector in response to the light radiated from one or more periodic test patterns carried by a re-useable calibration wafer while such a test pattern is being exposed to an aerial image of a matching calibration mask. Overlay alignment suitably is evaluated by stepping the pattern on the wafer from side-to-side and fore and aft of the aerial image while monitoring the photodetector for a peak output signal, whereby overlay alignment errors along the x-axis and y-axis of the exposure tool are determined by the displacement of the wafer positions at which such peak signals are detected from the positions at which such peak signals ae expected. Focus, on the other hand, suitably is evaluated by incrementally defocusing the imaging optics of the exposure tool while monitoring the rms width of the output signal generated by the photodetector as the wafer pattern is stepped through the aerial image of the calibration mask at each focal setting. The best focal setting minimizes the rms width of the output signal.

6 Claims, 5 Drawing Sheets

FOCUS AND OVERLAY CHARACTERIZATION AND OPTIMIZATION FOR PHOTOLITHOGRAPHIC EXPOSURE

This is a continuation, division, of application Ser. No. 06/876,316, filed Jun. 19, 1986, now abandoned.

FIELD OF THE INVENTION

This invention relates to photolithographic exposure tools and, more particularly, to methods and means for characterizing and optimizing the imagery (i.e., focus and overlay alignment) of photolithographic tools, such as step and repeat cameras, in situ.

BACKGROUND OF THE INVENTION

Photolithographic fabrication of state of the art microelectronic integrated circuits requires high resolution (one micron or even less) imaging, together with relatively little overlay error between successive masks. To that end, modern photolithographic exposure tools employ high numerical aperture imaging optics which enable them to achieve sub-micron resolutions, even though that causes them to have a very shallow depths of focus. Therefore, the focus and overlay error of such equipment are checked regularly, so that prompt corrective action may taken to compensate for variations in the focus, overlay alignment, magnification or similar operating parameters of the exposure tool.

Heretofore, the characterization and optimization of the imagery of photolithographic exposure tools typically have depended upon using the exposure tool to pattern a resist coated "dummy" wafer and then developing the resist to enable an operator to examine the pattern with an optical microscope and/or an electrical probe. Optimum focus conventionally is determined by a subjective examination of a focus/exposure matrix formed on the dummy wafer, even though the individual resolutions of the several resist patterns within such a matrix not only depend upon the actual optical resolution of the exposure tool, but also upon the uniformity of the resist processing across the wafer, the resolution of the resist, and the vibration of the image. Similarly, overlay errors normally are determined by comparing optical vernier patterns having finite resolutions down to 0.1 micron or so. Thus, even experienced, highly skilled operators can misinterpret the test data and make erroneous and potentially costly changes to the set-up of the exposure tool as a result of errors in judgement.

Techniques have been developed for evaluating the resolution and overlay alignment of photolithographic exposure tools in situ, thereby eliminating the expose/develop/examine cycle which causes the above-described set-up process to be so time consuming and labor intensive. See, for example, Brunner, T. A. and Smith, S. D., "Moire Technique for Overlay Metrology," *SPIE Proceedings*, Vol 480, May 1984, pp. 164–170. Briefly, it has been shown that the phase and contrast of moire fringes between a grating mask and a grating wafer mounted on an photolithographic exposure tool relate to the overlay error and resolution, respectively, of the exposure tool. Accordingly, an array of photodetectors have been provided for reading out such moire fringes on a pixel-by-pixels basis. However, a more straightforward in situ resolution and overlay alignment evaluation technique still is needed.

SUMMARY OF THE INVENTION

In accordance with the present invention, the focus and overlay alignment of photolithographic exposure tools of the type wherein the location of the wafer may be accurately positioned by a precise stage (typically controlled by a laser interferometer), such as in step and repeat cameras (sometimes referred to as "steppers"), are evaluated by monitoring the output signal generated by a photodetector in response to the light scattered or emitted (collectively referred to herein as "angularly radiated") by one or more diffusive or fluorescent, respectively, periodic test patterns carried by a re-useable calibration wafer while such a test pattern is being exposed to an aerial image of a matching calibration mask test pattern. The output signal vs. wafer position curve forms a representation of the actual aerial image profile. Overlay alignment is evaluated by stepping the pattern on the wafer from side-to-side and fore and aft of the aerial image while monitoring the photodetector for a peak output signal, whereby overlay alignment errors along the x-axis and y-axis of the exposure tool are determined by the displacement of the wafer positions at which such peak signals are detected from the positions at which such peak signals are expected. Focus, on the other hand, is evaluated by incrementally defocusing the imaging optics of the exposure tool while monitoring the rms width of the output signal generated by the photodetector as the wafer pattern is stepped through the aerial image of the calibration mask at each focal setting. The best focal setting minimizes the rms width of the output signal.

Preferably, focus and overlay alignment are evaluated at a plurality of locations on the calibration wafer, so that variations in the imagery of the exposure tool can be detected and taken into account. For example, the wafer test pattern suitably is carried by a die at the center of the wafer and by opposing radially displaced dies which align with the x-axis and the y-axis of the exposure tool, thereby enabling measurement of overlay error at five locations on the wafer. Alternatively, imagery can be measured at multiple locations across the lens field.

The calibration mask pattern and the calibration wafer test patterns suitably comprise checkerboard-like arrays of mutually orthogonal (x-oriented and y-oriented), periodic gratings which are frequency matched to each other in the wafer plane (i.e., the iamge plane of the mask). Advantageously, the mask pattern gratings having a significantly higher duty ratio than the wafer test pattern gratings as measured by the ratio of the width of the lines of a given grating to the width of the gaps between such lines, so that the side-to-side (x-axis) and the fore and aft (y-axis) overlay alignments of the exposure tool may be evaluated substantially independently.

BRIEF DESCRIPTION OF THE DRAWINGS

Still other features and advantages of this invention will become apparent when the following detailed description is read in conjunction with the attached drawings, in which.

DETAILED DESCRIPTION OF THE ILLUSTRATED EMBODIMENT

While the invention is described in some detail hereinbelow with reference to certain illustrated embodiments, it is to be understood that there is no intent to limit it to those embodiments. On the contrary, the aim is to cover all modifications, alternatives and equivalents falling within the spirit and scope of the invention as defined by the appended claims.

Figure 1:
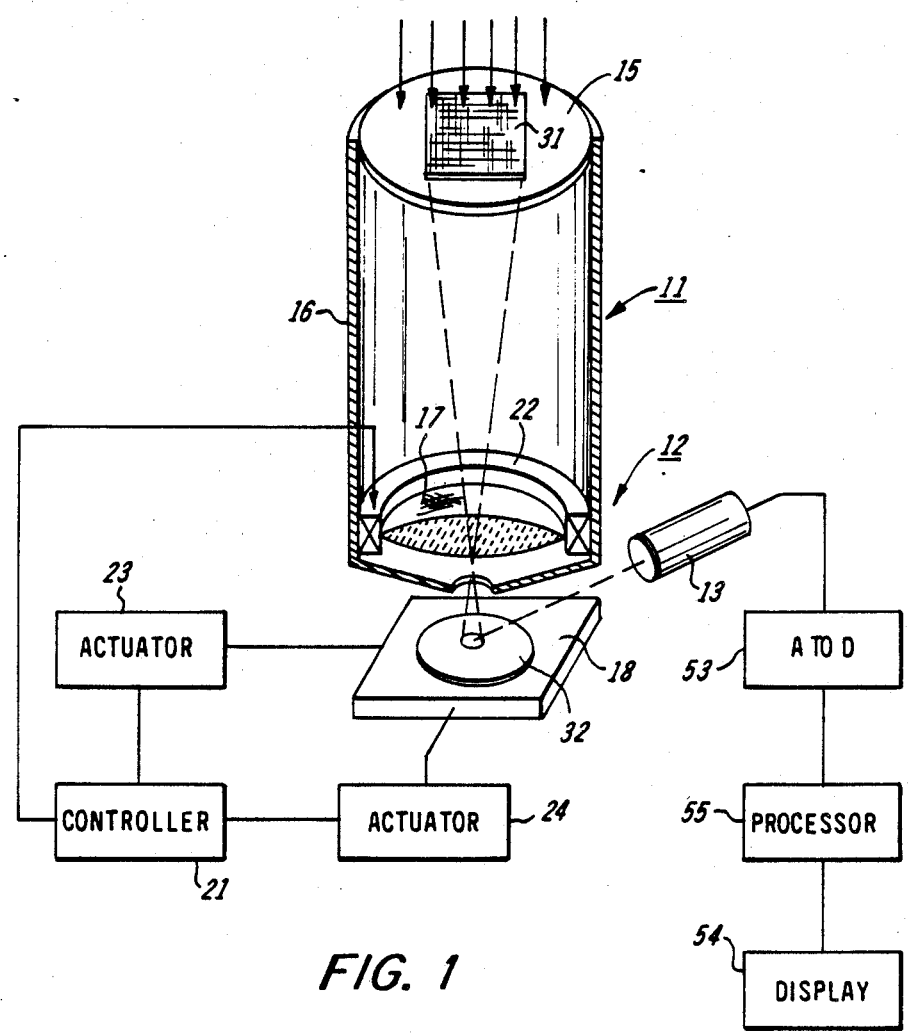
FIG. 1 is a partially cut-away, simplified schematic of a more or less conventional photolithographic step and repeat camera having an alignment and focus evaluation system constructed in accordance with the present invention.

Turning now to the drawings, and at this point especially to FIG. 1, there is a more or less conventional photolithographic step and repeat camera 11 having an optical detection system 12 for characterizing and optimizing the alignment and resolution of the camera 11 in accordance with the present invention. As will be seen, the detection system 12 is non-invasive and requires no significant modification of the camera 11. Its photoelectric pickup 13 suitably is housed within the environmental chamber (not shown) which customarily is provided for the camera 11.

In keeping with accepted practices, the step and repeat camera 11 has a reticle platen 15 mounted on an optical column 16, together with a wafer or laser stage 18 for supporting a wafer. During normal operation, a mask or reticle is placed on the platen 15 where it is illuminated by a mercury arc lamp (not shown), thereby causing imaging optics 17 within the optical column 16 to image the mask onto a resist coated wafer supported on a wafer or laser stage 18. The camera 11 steps the mask image across the wafer from die-to-die to sequentially expose the dies in accordance with the mask, and a shutter (not shown) within the optical column 16 controls the die exposure time.

Figure 4:
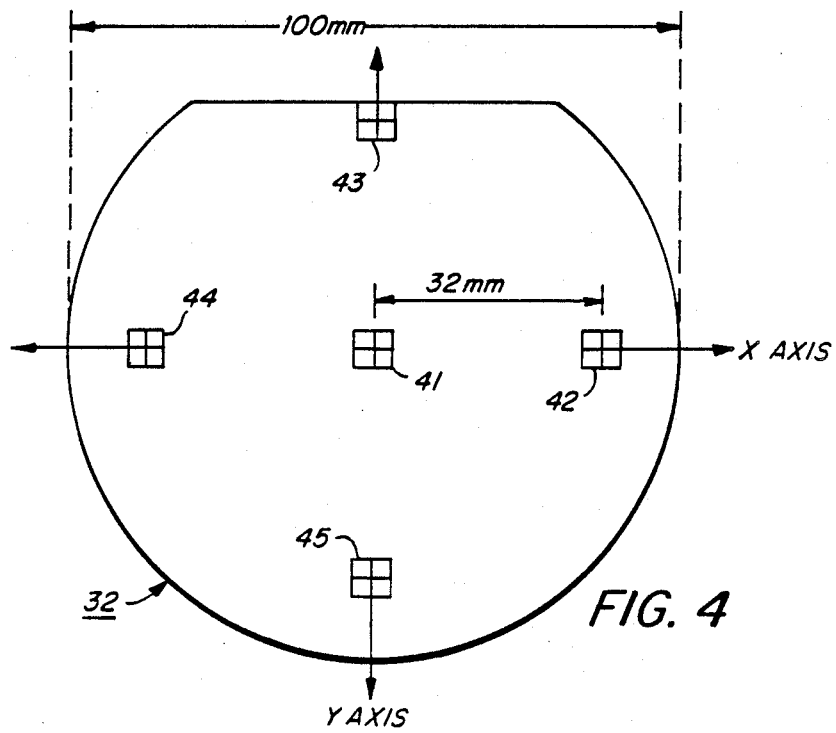
FIG. 4 is a simplified plan view of a calibration wafer for the alignment and focus evaluation system.

To prepare the camera 11 for operation, optical microscopes (not shown) are provided for aligning the mask on the reticle platen 15 and the wafer on the laser stage 18. Conventional indicia, such as a flat on the outer circumference of the wafer 32 (FIG. 4), are employed to properly angularly orient the calibration mask 31 and the calibration wafer 32 with respect to each other and with respect to the camera 11. Moreover, a programmable controller 21 drives a voice coil actuator 22 for moving the imaging optics 17 up and down within the optical column 16 to make fine z-axis (i.e., focus) adjustments to the camera 11. The controller 21 also drives an x-axis screw drive actuator 23 and a y-axis screw drive actuator 24 for moving the laser stage 18 from side-to-side and fore and aft, respectively, to make fine adjustments to the mask/wafer overlay alignment of the camera 11. As will be seen, the controller 21 is programmed to permit the overlay alignment and focus of the camera 11 to be evaluated and optimized.

Figure 2:
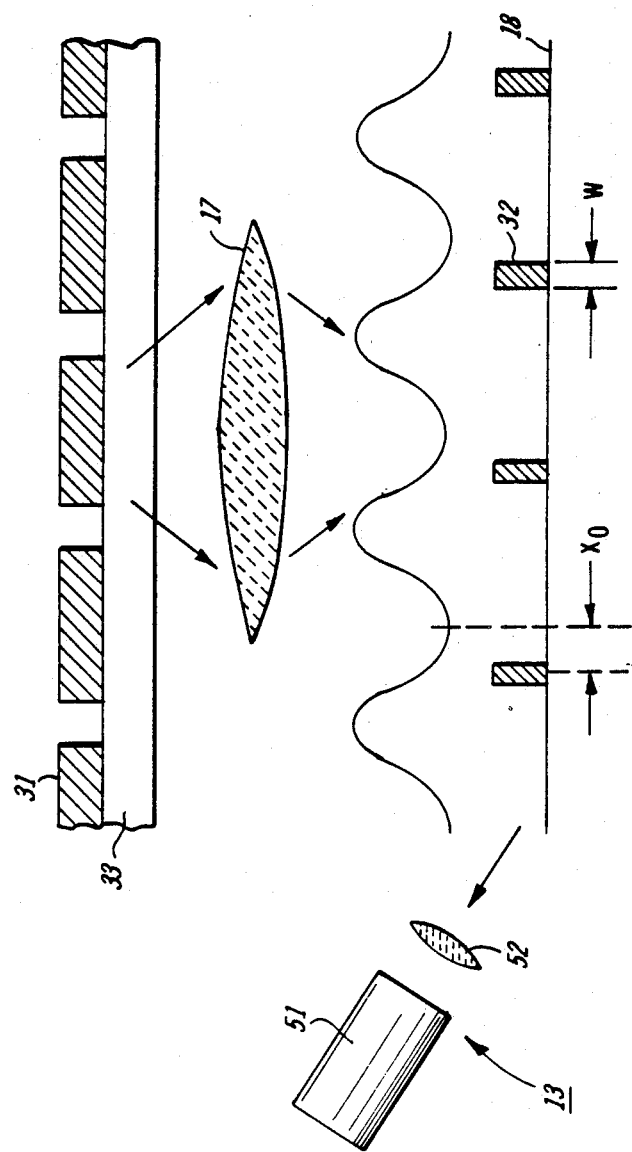
FIG. 2 is simplified elevational view of the alignment and focus evaluation system of this invention as applied to the photolithograhic exposure tool shown in FIG. 1.

In accordance with the present invention, as shown FIG. 2, a calibration mask 31 is mounted on the reticle platen 15 and a re-useable calibration wafer 32 is mounted on the laser stage 18 for evaluating the overlay alignment and the resolution of the camera 11 in situ under the control of the controller 21. In practice, the overlay alignment and focus of the camera 11 are checked and, if needed, adjusted periodically, such as once a day or even more frequently, so that any misalignment and/or change of focus is detected and corrected reasonably promptly. The calibration mask 31 and the calibration wafer 32 loaded onto and aligned with respect to the camera 11 in the usual manner prior to evaluating its alignment or resolution.

Figure 3:
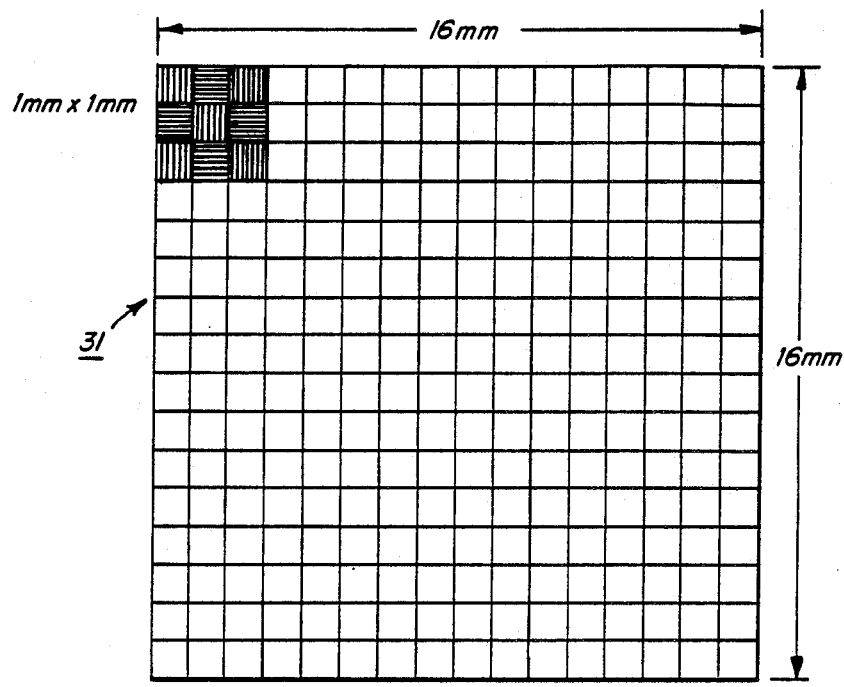
FIG. 3 is a simplified plan view of a calibration mask for the alignment and focus evaluation system.

To carry out the invention, the calibration mask or reticle 31 comprises a optically opaque patterned overcoating 32, such as chrome, on an optically transparent substrate 33, such as optical glass. The mercury arc lamp illuminates the mask 31, and the imaging optics 17 image it onto the calibration wafer 32 via the shutter (also not shown) in the usual way. When the calibration mask 31 is properly angularly oriented on the reticle platen 15, its patterning (FIG. 3) defines a checkerboard-like array of x-oriented and y-oriented, periodic gratings. Typically, the spatial frequency and the duty ratio of these gratings are selected so that they each image onto the calibration wafer 32 as a cyclically alternating pattern of bright and dark lines having widths of approximately 1.2 $\mu$m and 2.8 $\mu$m, respectively, and a pitch of about 4 $\mu$m. The calibration wafer 32 (FIG. 4), on the other hand, has a patterned overcoating 35 on a silicon substrate 36 to define five different test dies 41–45, one located centrally of the calibration wafer 32 and the others located radially outwardly therefrom at 90° intervals so that two of them align with the x-axis of the camera 11 and the other two align with its y-axis. The overcoating 35 is patterned so that each of the test dies 41–45 also has a checkerboard-like array of x-oriented and y-oriented periodic gratings, with each of these gratings having a pitch essentially equal to the 4 $\mu$m pitch of the imaged mask gratings, but a significantly narrower line or feature width of only 0.4 $\mu$m or so. In other words, the pitch or spatial frequency of the calibration mask gratings, as measured on the wafer 32, are matched as precisely as possible to those of the gratings carried by the wafer 32, but the wafer gratings have a significantly lower duty ratio than the mask gratings.

In keeping with one of the more detailed features of this invention, the calibration mask 31 may be employed to pattern the calibration wafer 32. To that end, a suitably doped polysilicon coated silicon wafer is overcoated with a suitable photoresist which is then overexposed at the site of each of the test dies 41–45 to an image of the calibration mask 31 while the wafer 32 is being shifted slightly first in one direction and then in the other direction along both the x-axis and the y-axis of the camera 11. The motion of the wafer 32 during the exposure process reduces the line width of the gratings which remain thereon after the photoresist is developed, and the overexposure of the photoresist sharpens the edge profiles of the grating lines. The wafer 32 may be simultaneously shifted along both the x-axis and the y-axis of the camera 11, such as by translating it back and forth at approximately 45°. Phosphorous doped polysilicon is a suitable overcoating for the calibration wafer 32 because it is sufficiently rough to diffusively scatter incident radiation. Alternatively, however, the wafer gratings may be fabricated by bi-level resist processing, utilizing a PMMA bottom layer which has been heavily doped with a suitable fluorescent dye, such as Coumarin 6 dye, to fluoresce at a wavelength, such as in the green portion of the spectrum, which is well separated from the wavelength of the blue light supplied by mercury arc lamp of the exposure tool 11. See, K. Bartlett et al., "A Two Level Photoresist Process in a Production Environment," *SPIE*, Vol. 394, pp. 49–56, 1983. The calibration mask 31 may be employed to pattern the wafer gratings substantially as previously described.

Figure 5:
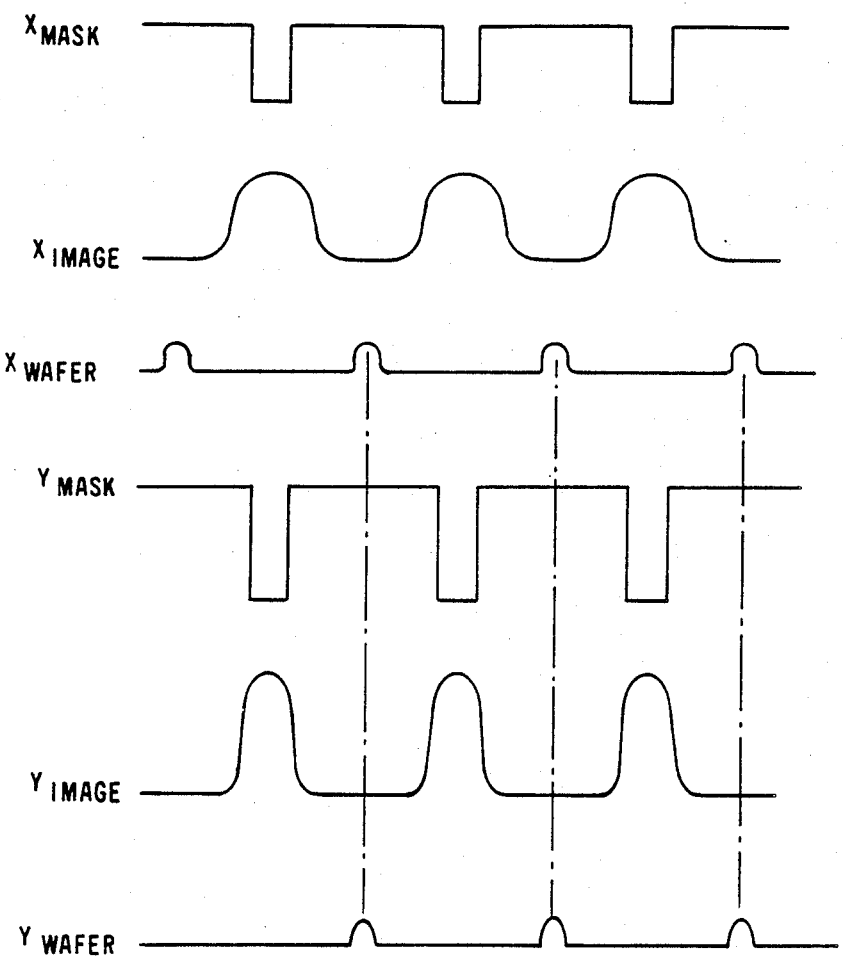
FIG. 5 is a decomposed scan diagram illustrating the relationships existing between the calibration mask and a wafer test pattern during a typical scan of the wafer test pattern through the mask image.
Figure 6:
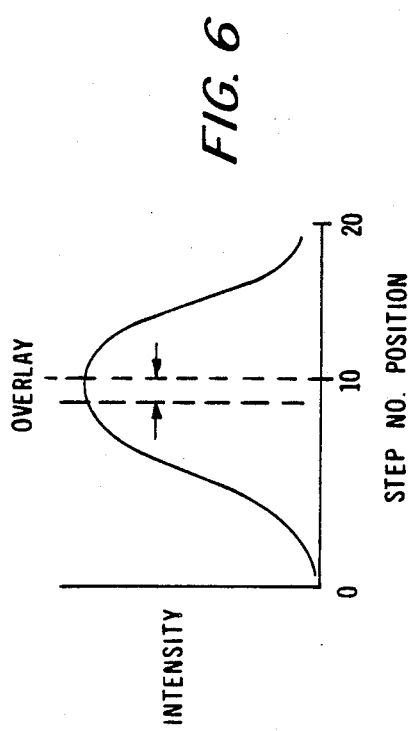
FIG. 6 is an intensity versus position profile illustrating the database produced while performing a typical overlay alignment evaluation routine in accordance with this invention.

Referring to FIGS. 2 and 5, the overlay alignment of the camera 11 is evaluated at a given location along its x-axis by monitoring the output signal produced by a photodetector 51 while the laser stage 18 is incrementally advanced in steps of predetermined size, such as 0.2 μm/step, to scan the x-oriented gratings on the test die in the x-direction relative to the aerial image 50 of the calibration mask 31. Collection optics 52 collect light scattered from or emitted by (i.e., angularly radiated by) the x-oriented gratings on the test die and focus it onto the photodetector 51, so that the output signal produced by the photodetector 51 varies as a function of the position of the test die grating relative to the calibration die grating (FIG. 6). Such light radiates only from grating lines and not from the gaps therebetween, so the output signal of the photodetector 51 is an accurate representation of the scanned image 50 of the mask 31. The laser stage 18 precisely positions the test die grating relative to the expected or perfectly aligned position of the mask image at the start of scan, for example 180° out of phase therewith, thereby establishing a baseline which permits the overlay error along the x-axis to be measured by counting the number of steps between the expected peak and the actual peak of the output signal of the photodetector 51. As shown in FIG. 5, the y-oriented gratings of the test die preferably are aligned more or less centrally of the opaque areas of the calibration mask 31 (i.e., approximately 180° out of phase with y-oriented mask gratings) while the x-axis overlay alignment is being measured, so they radiation from them is minimal and substantially constant. Y-axis overlay alignment is measured more or less independently in precisely the same way using a the y-oriented wafer gratings for a y-axis scan of the y-axis mask image. Moreover, the x-axis and y-axis overlay alignment evaluation processes can be repeated each test die 41–45 to generate a full set of overlay error vectors. As will be appreciated, the substantially independent x and y-axes scans of the test dies 41–45 (FIG. 4) relative to the aerial image 50 of the calibration mask 31 (FIG. 2) permits the imagery of the camera 11 (FIG. 1) to be evaluated for overlay error and astigmatism at several points across the test wafer 32.

Figure 7:
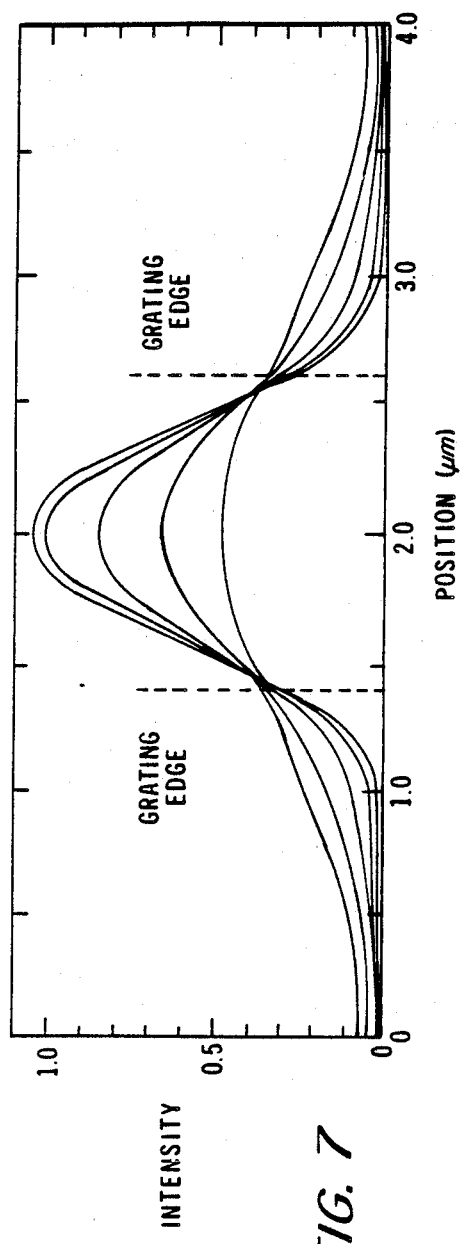
FIG. 7 is a family of intensity profiles at different focal settings which illustrate the database produced while performing a typical focus evaluation routine in accordance with this invention.

Turning now to FIGS. 2 and 7, the focus of the camera 11 is evaluated in much the same manner as its overlay alignment, except that the imaging optics 17 are incrementally defocused to enable the photodetector 51 to monitor the amount of light scattered by the gratings on a given test die as the die is incrementally scanned through the aerial image of the calibration mask 31 while the camera 11 is operating at different focal settings. As shown in FIG. 7, the output of the photodetector 51, therefore, describes a family of curves (one for each of the focal settings of the camera 11), with the curve having the narrowest rms width uniquely identifying the best or optimal focal setting.

Typically, the output of the photodetector 51 is fed through an A to D converter 53 and then to a display 54 via a processor 55 having suitable interpretative software for converting the data into metrics most readily understood by an operator. The operator, in turn, uses the displayed values to determine what, if any, corrections need to be entered into the controller 21 to bring the overlay alignment and/or the focus of the camera 11 into proper adjustment.

CONCLUSION

In view of the foregiong, it will now be understood that the present invention provides a relatively straightforward and reliable method and means for evaluating the overlay alignment and the resolution of a photolithographic exposure tool in situ. While peak intensity and minimum rms width of the output signal of the photodetector 51 have been identified as being appropriate indications of the overlay alignment and optimal focus, respectively, of the photolithographic exposure tool 11, it will be understood that other algorithms could be utilized. For example, since the photodetector 51 generates a signal which accurately represents the aerial image of the calibration mask 31, the shape of the photodetector output signal could be used to quantatively evaluate the resolution of the system, thereby allowing direct comparison with theoretical calculations of diffraction limited imagery.

What is claimed is:

1. In combination with a photolithographic exposure tool having a reticle platen, a wafer stage, a light source for illuminating said platen, and imaging optics disposed between said reticle platen and said wafer stage; the improvement comprising a calibration wafer mounted on said wafer stage, said wafer having a plurality of test dies positioned at different locations thereon, each of said test dies being patterned to have a checkerboard-like array of periodic, mutually orthogonal gratings oriented to align along an x-axis and a y-axis of said exposure tool, the gratings on said test dies having a predetermined spatial frequency and a predetermined duty ratio;

a calibration mask mounted on said reticle platen, said mask being imaged onto said calibration wafer by said imaging optics to produce an aerial image of said mask, said mask being patterned to have a checkerboard-like array of periodic, mutually orthogonal gratings oriented to aling along the x-axis and the y-axis of said exposure tool, the aerial image of said mask gratings having a spatial frequency and a duty ratio which are essentially equal to and substantially greater than said predetermined spatial frequency and said predetermined duty ratio, respectively;

a single photodetector positioned to produce an electrical output signal in response to light angularly radiated from said test dies; and means for scanning one after another of said test dies transversely with respect to the aerial image of said mask gratings, first along one of said axis and then along the other of said axis;

whereby the output signal of said photodetector varies over time to provide an x-y scanned representation of the aerial image of said mask gratings at each of said test die locations.

2. The improvement of claim 1 wherein
the output signal of said photodetector is monitored to evaluate the overlay alignment of said exposure tool at each of said test die locations.

3. The improvement of claim 1 wherein
said imaging optics are incrementally defocused while said mask is being imaged onto one of said test dies, said one test die is being image is repeatedly advanced along the x-axis and y-axis of said exposure tool to cause the x-oriented and y-oriented wafer gratings thereon to scan said image at each defocus increment, and the output signal of said photodetector is monitored to identify an optimum focus of said imaging optics.

4. The improvement of claim 3 wherein
the output signal of said photodetector is also monitored to evaluate the overly alignment of said exposure tool at each of said test die locations.

5. The improvement of claim 3 wherein
said wafer has a relatively rough polysilicon overcoating which is patterned to define said wafer grating, whereby said angularly radiated light is scattered from said wafer grating.

6. The improvement of claim 4 wherein
said wafer has a bi-resist flourescent overcoating which is patterned to define said wafer grating, whereby said angularly radiated light is flourescence from said wafer grating.

* * * * *